(12) United States Patent
Larsson et al.

(10) Patent No.: US 6,246,727 B1
(45) Date of Patent: *Jun. 12, 2001

(54) METHOD AND SYSTEM FOR TUNING RESONANCE MODULES

(75) Inventors: Lennart Larsson, Akersberga; Rolf Folkesson, Brottby; Björn Johansson, Täby, all of (SE)

(73) Assignee: Allgon AB, Akersberga (SE)

(*) Notice: Subject to any disclaimer, the term of this patent is extended or adjusted under 35 U.S.C. 154(b) by 0 days.

This patent is subject to a terminal disclaimer.

(21) Appl. No.: 09/109,746

(22) Filed: Jul. 6, 1998

Related U.S. Application Data

(63) Continuation-in-part of application No. 08/890,215, filed on Jul. 9, 1997, now Pat. No. 6,041,083.

(30) Foreign Application Priority Data

Jul. 10, 1996 (SE) .................................................. 9602740

(51) Int. Cl.[7] ...................................................... H03C 3/00
(52) U.S. Cl. .................... 375/304; 455/115; 455/121; 455/123; 455/193.1
(58) Field of Search .................................. 375/304, 295; 455/115, 121, 123, 125, 193.1

(56) References Cited

U.S. PATENT DOCUMENTS

| 3,271,684 | 9/1966 | Simon | 325/175 |
| 4,551,682 | * 11/1985 | Charpentier et al. | 328/22 |
| 6,041,083 | * 3/2000 | Larsson et al. | 375/304 |

FOREIGN PATENT DOCUMENTS

| WO90/06627 | 6/1990 | (WO) . |
| WO92/12577 | 7/1992 | (WO) . |

* cited by examiner

*Primary Examiner*—Stephen Chin
*Assistant Examiner*—Mohammad Ghayour
(74) *Attorney, Agent, or Firm*—Jacobson, Price, Holman & Stern, PLLC

(57) ABSTRACT

A method and a system for tuning a resonance module in e.g. a radio base station are disclosed. The resonance module has tuning means, a transmitter connection, and an antenna connection. First frequency input and output signals on the transmitter and antenna connection, respectively, are sensed and processed to tune the resonance module to a frequency of the input signal on the transmitter connection. The processing of the sensed input and output signals includes processing in a second frequency range. Prior art methods are improved by the invention through e.g. the use of a quadrature modulator to increase adjustment speed and overall applicability of the resonance module to be tuned.

10 Claims, 3 Drawing Sheets

METHOD AND SYSTEM FOR TUNING RESONANCE MODULES

This application is a Continuation-in-Part application based upon U.S. application Ser. No. 08/890,215, filed Jul. 9, 1997 now U.S. Pat. No. 6,041,083.

FIELD AND BACKGROUND OF THE INVENTION

The present invention relates to a method and a system for tuning a resonance module in a radio base station. The resonance module having tuning means, a transmitter connection, and an antenna connection. High-frequency input and output signals on the transmitter and antenna connection, respectively, are sensed and processed to tune the resonance module to a frequency of the input signal on the transmitter connection. The processing of the sensed input and output signals includes processing in a low-frequency range.

Such an arrangement for tuning resonance modules is disclosed in the published PCT Application No. SE92/0004. That resonance module includes a resonant cavity and a resonance body, the position of which is adjustable by means of a motor to control the resonance frequency of the resonance module. As long as there is a phase difference between high-frequency input and output signals of the resonance module, the arrangement adjusts the position of the resonance body so as to reduce that phase difference. This prior art arrangement includes a voltage controlled oscillator that generates a high-frequency signal which is mixed with the input signal and the output signal in first and second mixers, respectively. Thus, two low-frequency signals are formed, the phase difference of which is a measure of a mistuning of the resonance module. Dependent thereon, the resonance module is tuned by means of the motor to a correct resonance frequency being the frequency of the input signal of the resonance module.

However, in this prior art arrangement, the voltage controlled oscillator is a relatively complicated and expensive component, which is required to have high dynamic performance since a relatively wide frequency range has to be scanned in the prior art tuning method.

SUMMARY OF THE INVENTION

One object of the present invention is to provide a method for tuning a resonance module, which method reduces the time required for tuning the resonance module in response to variations in the frequency of an input signal of the resonance module. Further objects of the invention are to provide an efficient and accurate method wherein plural resonance modules can be tuned in a sequential process or in parallel processes, wherein multiplexing can be used to reduce required circuitry, wherein a VCO may be omitted, wherein a particularly efficient self-test and adjustment routine can be used in production as well as in operation, and/or wherein a low-frequency signal is efficiently generated, and to provide an efficient and cost-effective system for tuning a resonance module, in particular, for carrying out the method according to the invention.

These and other objects are attained by the method and the system according to the invention.

Advantages of embodiments of the inventive method and system are that different sensing may be performed in the same branch of the circuitry of the system leading to a reduction of possible measurement errors, that very fast "frequency hopping" may be performed if a fast tuning means is applied in the regulation system of the invention, that only the phase relation between the transmitter signal and the antenna signal remains in the low-frequency signal resulting in independence of the presently employed modulation width. It is possible in the inventive method and system to lower requirements on some major components to be connected to the resonance modules while still improving the tuning performance.

In particular, the inventive method may comprise the steps of: mixing an input signal, which is originating from a transmitter signal present on the transmitter connection, with a low-frequency signal so as to generate a single side band signal; mixing with the single side band signal an output signal being offset in phase from the input signal by a relative first phase difference dependent on a present tuning of the resonance module. The output signal being one in a group consisting of: a split portion of an antenna signal present on the antenna connection and a signal probed within the resonance module; mixing with the single side band signal a split portion of the transmitter signal on the transmitter connection; comparing, at a frequency range about the frequency of the low-frequency signal, mixing products resulting from the mixing of the single side band signal with the input and output signals, respectively, so as to determine a relative second phase difference between the input and output signals; operating, based on said second phase difference, the tuning means to tune the resonance module in order to adjust the second phase difference to a predetermined value or to be within a predetermined value range, so as to tune the resonance module to a present frequency of the input signal. It is pointed out that, depending on for instance technical requirements, other quantities than signal phase may be used in the inventive method.

The inventive method and system are applicable to any type of resonance modules including, but not limited to, cavity resonators, half-wave or quarter-wave resonators, and wave-guide resonators.

Further advantageous developments of the invention are set forth in the detailed description and other objects as follows:

It is an object of the invention that the second frequency is lower than the first frequency.

It is an object of the invention that the signal characteristics is at least one selected from a group consisting of: signal phase and signal amplitude.

A further object of the invention is mixing the input signal with the low-frequency signal in a quadrature modulator to generate the single-side-band signal, which is offset in frequency by a frequency difference between the mixing signal and the input signal.

Another object of the invention is low-pass filtering the mixing product resulting from the mixings of the single side band signal with the input and the output signals, respectively, so as to block frequencies above a frequency range about the mixing signal.

It is an object of the invention that the multiplexing and processing further input and output signals of further resonance modules are using common measurement circuitry and a common signal processing unit.

Another object of the invention is that the parallel processing further input and output signals of further resonance modules are using separate measurement circuitry and a common signal processing unit.

A further object of the invention is that multiplexing signals are to be mixed with the single-side-band signal.

DESCRIPTION OF A PREFERRED EMBODIMENT OF THE INVENTION

Figure 1:
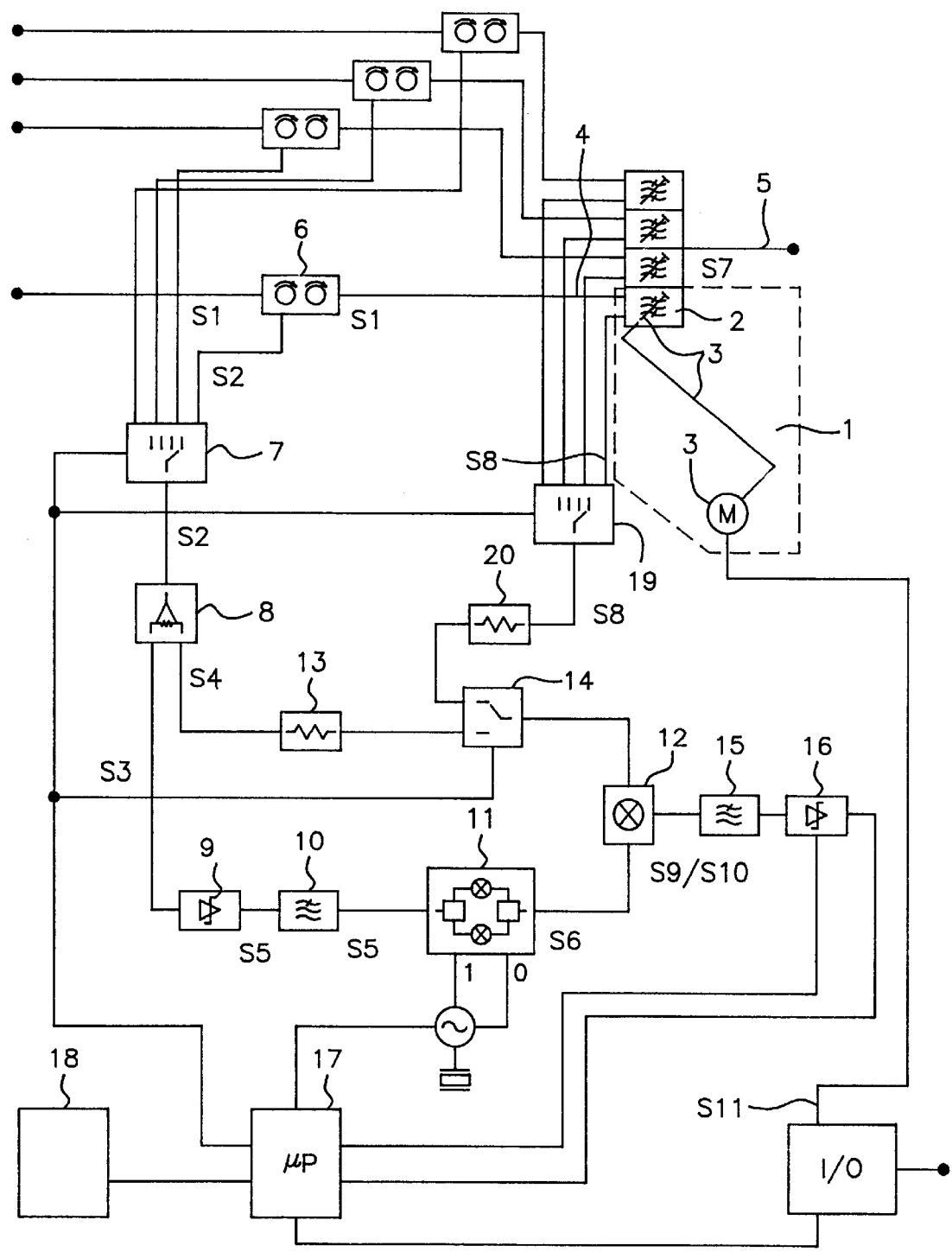
FIG. 1 shows a block diagram of a resonance module tuning system including a single-side-band generator.

With reference to FIG. 1, a depicted combiner unit intended for a base station in, e.g., a PCS mobile telephone system, is provided with one embodiment of the invention. In the combiner unit, four tunable resonance modules are arranged to be connected to four transmitter outputs via four respective isolators and to a transmitting antenna.

An improved system for tuning a first resonance module 1 comprises a tunable resonator 2 having tuning means 3, a transmitter connection 4, and an antenna connection 5. The system further comprises an isolator 6, which includes two circulator elements and a first sensor for sensing a transmitter signal S1 from a transmitter, passing the isolator 6, to the transmitter connection 4 of the resonance module 1. The first sensor in the isolator 6 produces an input signal S2 that is essentially a small fraction of the transmitter signal S1.

The input signal S2 is fed via a first multiplexer 7 to be described further below to a power splitter 8, which splits the input signal in signals S3 and S4. The signal S3 is fed via a limiting amplifier 9 and a band-pass filter 10, producing a signal S5 which is input to a quadrature modulator (single-side-band generator) 11, known per se, wherein the signal S5, still being a measure of the transmitter signal S1, is mixed with a low-frequency (intermediate frequency) signal in immediate (0°) and quadrature (90°) phases I and Q, respectively. The output signal S6 of the quadrature modulator is a single side band of the mixing product of signal S5 derived from signal S1 and the low-frequency signal. Consequently, a frequency of signal S6 is always offset from signal S1 by the frequency of the low-frequency signal, the latter being constant. Further, a phase of signal S6 is always offset from that of signal S1 by a constant phase difference. Signal S6 is fed from the quadrature modulator 11 to a mixer 12.

Signal S4 is fed from the power splitter 8 via an attenuator 13 and a second multiplexer 14 to the mixer 12. The mixer 12 thus produces from signals S6 and S4 a mixing product signal S9 which is fed via a low-pass filter 15 and a second limiting amplifier 16 to a signal processing means 17 wherein the phase of the mixing product signal S9 is measured and stored in a memory 18.

The system further includes a second sensor arranged inside the resonator 2 for sensing an antenna signal S7 to produce an output signal S8, which is to be compared to signal S2 in order to determine a relative phase difference. That phase difference is a measure of a relative difference between a frequency of the transmitter signal and the frequency to which the resonance module is presently tuned. Signal S8 is essentially a small fraction of the antenna signal S7. Alternatively, the output signal could be sensed on the antenna connection 5 to produce a signal to be used instead of signal S8. In that case, signals originating from other transmitters would be more of a problem. For an ideal tuning of the resonance module, the phase difference between the transmitter signal on the transmitter connection 4 and the antenna signal on the antenna connection 5 is zero.

Signal S8 is fed from the second sensor via a third multiplexer 19 to be described further below, an attenuator 20, and the second multiplexer 14, which is alternately switched to connect either signal S4 or signal S8, to the mixer 12. When the multiplexer 14 connects signal S8, the mixer 12 thus produces from signals S6 and S8 a mixing product signal S10 which is fed via the low-pass filter 15 and the second limiting amplifier 16 to the signal processing means 17 wherein the phase of signal S10 is measured and stored in the memory 18. The stored phase measurements are then compared to determine the phase difference between signals S9 and S10.

Of course, the real time difference between the measurements is known and determined by the signal processing unit 17. The sequence of connecting signals S4 and S8 by the second multiplexer 14 is not critical to the measurement principles. However, starting a measuring cycle by connecting signal S8 is preferred. Alternatively, the measurements of signals S4 and S8 could be made in separate branches with corresponding changes in the circuitry, avoiding the use of the multiplexer 14.

The signal processing means 17 operates by fast and accurate measurement and regulation of the phase of the transmitter signal S1 relative to the phase of the antenna signal S7. Inherently, the phase measurement performed in the signal processing unit 17 involves an essentially constant additive phase difference dependent on signal delay in the circuitry of the system. However, that inherent phase difference is compensated for by calibration, so that the relative phase difference measured between signals S9 and S10 is adjusted to a predetermined value at which the resonance module is tuned to a present frequency generated by the respective transmitter.

In the system depicted in FIG. 1 and described above, the first and third multiplexers 7 and 19 are controlled by the signal processing unit 17 so as to share the same regulation circuitry between four essentially identical resonance modules forming a combiner unit with four separate transmitter connections and one common antenna connection. The adjustment of the remaining three resonance modules is performed essentially the same way as indicated above with reference to the first resonance module 1. The number of resonance modules in the combiner unit may differ from that of this embodiment.

The signal S2 needs to be well isolated from, e.g., any interfering signals possibly present on the common antenna connection. Thus, the first sensor is arranged to the transmitter side of the isolator 6. Therefore, also in the prior art, an isolator, like the one referred to by the numeral 6, is typically a rather complicated and costly component, which is required to have a very well defined signal delay from its input connection to its output connection, in order for a corresponding regulation circuitry to be shared between plural resonance modules.

Therefore, in a second embodiment of the invention, an additional third sensor is provided between each isolator and the respective resonance module, for sensing a signal corresponding to signal S4 above. Further, the multiplexer 7 is omitted and a signal corresponding to signal S2 from the first sensor above is fed directly to a limiting amplifier corresponding to amplifier 9 above. Likewise, the third multiplexer 19 is omitted and an output signal sensed in the respective resonance module is fed directly to an attenuator corresponding to attenuator 20 above. Thus, major parts of the regulation circuitry is provided separately for each resonance module, although they have a common signal processing and control unit. In this second embodiment of the invention, a much less complicated isolator may be used, since a relative difference between signal delays in the different isolators would have to be neither well defined, nor constant with regard to, e.g., variations in ambient temperature.

In the described embodiments, an electrical step motor, controlled by a signal S11 from the signal processing unit, performs adjustment of a first resonance module by moving via a mechanical link a tuning element in the resonator of the resonance module. The motor sets a limit to the speed of adjustment of the resonance module. In case the transmitter operates at a present frequency, but transmits intermittently, the speed of movement of the tuning element may be, e.g., divided by two every time the motor changes direction of movement, so as to arrive at resonance more efficiently. Moreover, the described regulation principles of the invention could be applied even more efficiently if faster means than step motors could be used to adjust the resonance of the resonance module.

The limiting amplifier 16 depicted in FIG. 1 may also generate a radio signal strength indicator (RSSI) signal. That signal may be fed to the signal processing unit 17 and serve as an indicator of whether there is a signal present on the respective transmitter connection which is strong enough for measuring. Moreover, it may serve as a coarse measure of the adjustment of the resonance module.

Figure 2:
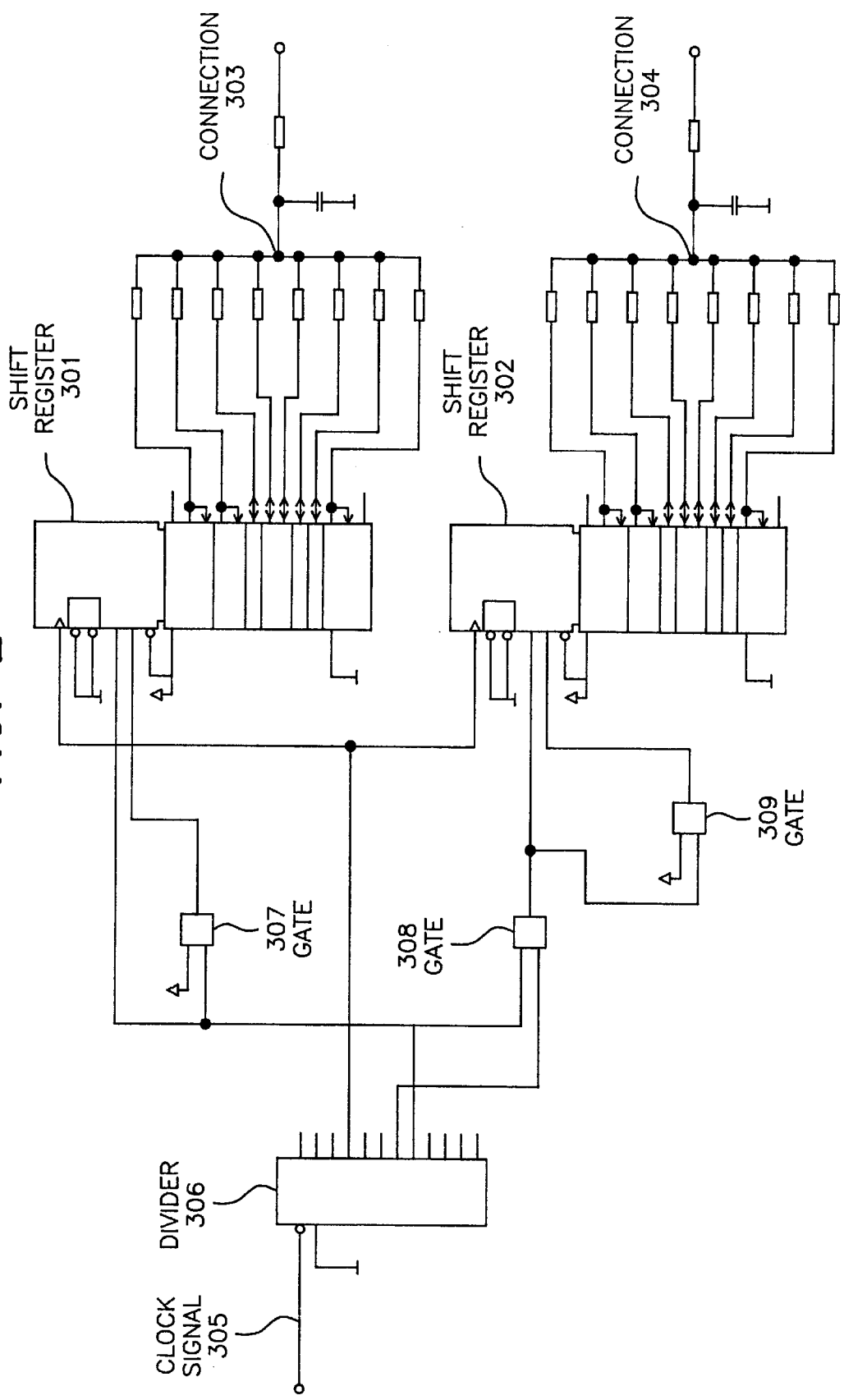
FIG. 2 shows a sine-cosine signal generator used by the single-side-band generator of the tuning system of FIG. 1.

With reference to FIG. 2, a signal generator for providing the single-side-band generator with sine and cosine signals, extensively free of overtones, comprises first and second reversible shift registers 301, 302. Each shift register has eight outputs, which are each connected to one side of a respective resistor. The other side of the resistors are interconnected at 303, 304 and fed via a smoothing filter and a sixteenth-overtone filter (not shown) to the respective one of the I and Q inputs of the quadrature generator(s) referred to above. A clock signal 305 of the signal processing unit 17 (FIG. 1) is input to a divider 306 which feeds at a first output, having a relative frequency of 1:1, clock pulses to clock inputs of the shift registers 301, 302. Second and third outputs, having relative frequencies 1:8 and 1:16, of the divider 306 are fed via EXOR gates 307, 308, 309, in such a manner that ones (1) are shifted into the shift registers 301, 302 with a relative difference of four clock pulses (corresponding to 90°) until the respective shift register is filled with ones (1) and, then, changing the direction of shifting, zeros (0) are shifted into the shift registers from the other direction, still with a four pulses relative difference. Values of the resistors are selected so that the generated sine and cosine signals are distorted by less than approximately 2%. Due to this way of generation, the signals have a very well defined relative phase difference of 90°, which is needed in the quadrature modulator 17 (FIG. 1). The frequency used in the invention may by in the range of 50 kHz.

A preferred automatic test and calibration/adjustment routine for the inventive system, which can be applied both in production and when the resonance modules are installed for operation, may include the steps of: Bringing all tuning means to a predetermined starting position, preferably an end position outside an operating frequency range so that interconnected resonance modules do not disturb one another; (Operating the resonance modules one at a time by) applying a measuring signal, preferably non-modulated, at the transmitter connection of the resonance module; Operating the tuning means of the resonance module past a resonance peak to a remote −3 dB point and then back to a nearby −3 dB point, while sensing the signal strength and identifying the points with, e.g., the RSSI function described above as well as recording the corresponding signal phases; Selecting a signal phase value, corresponding to the second phase difference above, as a predetermined target value in the future adjustment of the resonance module. The resonance module is tuned to resonance at a midpoint in the signal phase range between the −3 dB points. In this example, the −3 dB points in relation to a top signal strength are chosen for convenience and represent a phase difference of 90°. Other points than the −3 dB points and other means for signal strength measurement than the RSSI signal may be used.

Figure 3:
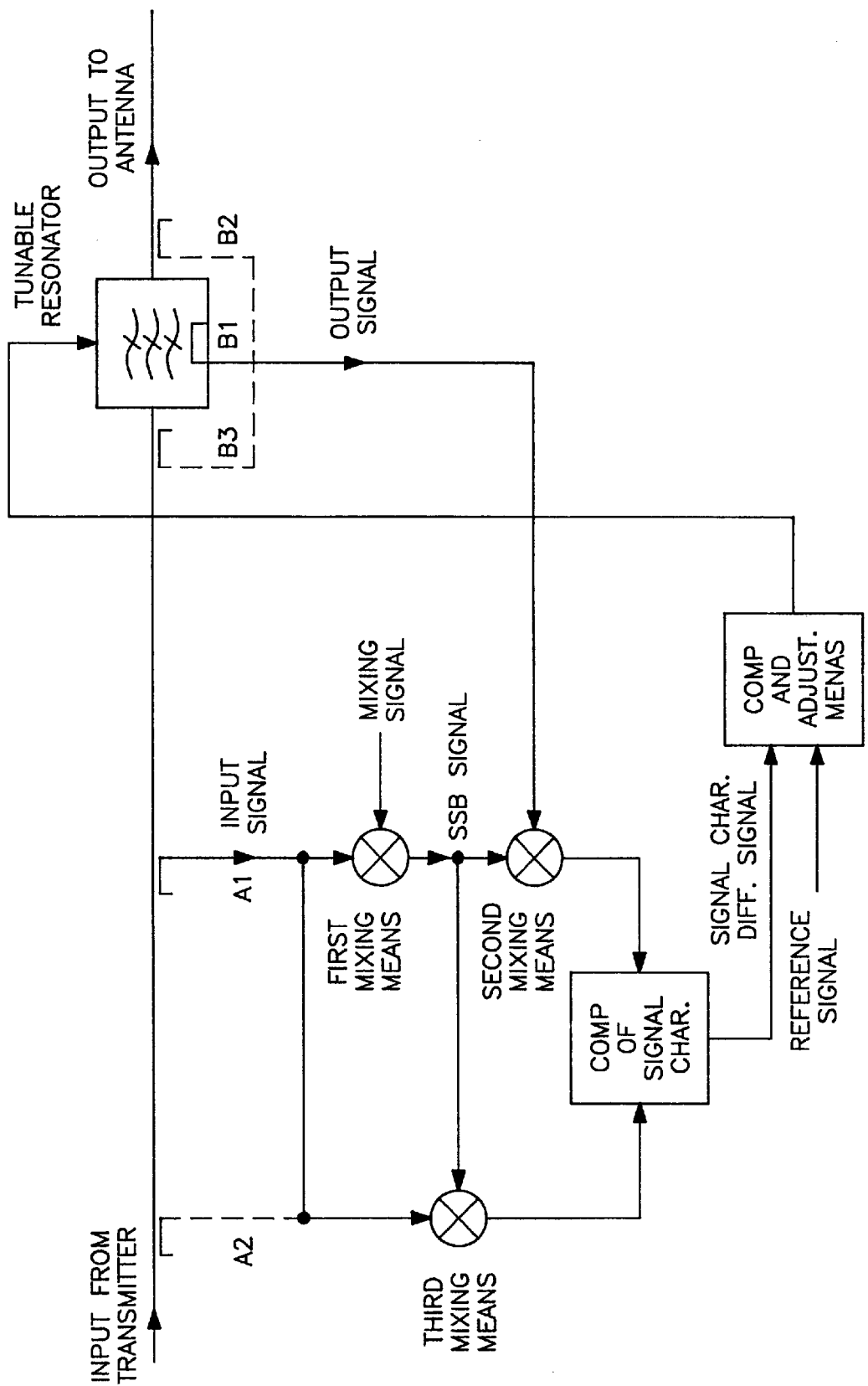
FIG. 3 shows a block diagram of alternative embodiments of the invention wherein signal characteristics of input and output signals are compared to provide a basis for tuning a filter in accordance with the present invention.

With reference to FIG. 3, a system for tuning a resonator, in the preferred cases a band pass cavity resonator filter or a band pass ceramic resonator filter, includes an input from a transmitter connected to a tunable resonator that filters the signal to produce an output to an antenna, preferably to be shared between several channels of different frequencies. The input is sensed at A1, preferably by means of a directional coupler, to produce an input signal to be fed to a tuning means. An output signal is produced to be fed to the tuning means. The output signal is a signal which is a result of a perturbation by the resonator of the signal from the transmitter. The difference in characteristics between the input and output signals provides an indication of a tuning state of the resonator relative a signal which is input from the transmitter. This output signal may be a sensed signal originating from transmission at B2 or reflection at B3 in the resonator. In fact, as explained above, that may be a signal sensed at B1 within the resonator.

The tuning means of FIG. 3 is substantially similar to what has been described above with references to FIGS. 1 and 2 and it comprises generally mixing means and comparator means providing appropriate tuning impulse(s) to the resonator, generally, to adjust to a present input from the transmitter. The input signal is mixed in a first mixing means to produce a single side band (SSB) signal. The SSB signal is mixed in a second mixing means with the output signal to produce a first input to a comparator of signal characteristics. Also, the input signal, which may be sensed for this purpose at another point A2 along the input from the transmitter, is mixed in a third mixing means to produce a second input to said comparator.

The comparator compares signal phase, signal amplitude, or any other suitable signal characteristic, to produce a signal characteristics difference signal. This signal is compared to a reference signal, e.g., a value or a range, to appropriately adjust the resonator. This operation is generally carried out in a comparison and adjustment means coupled to the resonator.

Although the invention has been described in conjunction with preferred embodiments, it is to be understood that various modifications may be made without departing from the spirit and scope of the invention as defined by the appended claims. Thus, the invention incorporates any system for carrying out the method defined by the method claims.

What is claimed is:

1. A method for tuning at least one tunable resonance module in a radio base station, said resonance module having tuning means, a transmitter connection, and an antenna connection, said method comprising the steps of:

(a) mixing an input signal, originating from a transmitter signal present on the transmitter connection, with a mixing signal having a second frequency, so as to generate a single side band signal, said input signal having a first frequency and first signal characteristics, (b) mixing with the single side band signal an output signal being perturbed in signal characteristics from the input signal by a first difference in characteristics dependent on a present tuning of the resonance module, said output signal being one in a group consisting of: a signal originating from an antenna signal present on the antenna connection, a signal probed within the resonance module, and a signal reflected in said resonance module, said output signal having a second frequency and second signal characteristics, (c) mixing the single side band signal with a signal originating from the transmitter signal on the transmitter connection, (d) comparing, at a frequency range about that of the mixing signal, mixing products resulting from the steps (b) and (c), respectively, so as to determine a second difference in characteristics between the input and output signals, (e) operating, based on said second difference, the tuning means to tune the resonance module to a frequency of the transmitter signal present on the transmitter connection, so as to adjust said second difference to a predetermined value.

2. The method according to claim 1, wherein said second frequency is lower than said first frequency.

3. The method according to claim 1, wherein said signal characteristics is at least one selected from a group consisting of: signal phase and signal amplitude.

4. The method according to claim 1, wherein the step (a) further comprises mixing the input signal with the low-frequency signal in a quadrature modulator to generate the single-side-band signal, which is offset in frequency by a frequency difference between the mixing signal and the input signal.

5. The method according to claim 1, wherein the step (d) further comprises low-pass filtering the mixing product resulting from the mixings of the single side band signal with the input and the output signals, respectively, so as to block frequencies above a frequency range about the mixing signal.

6. The method according to claim 1, further comprising multiplexing and processing further input and output signals of further resonance modules using common measurement circuitry and a common signal processing unit.

7. The method according to claim 1, further comprising parallely processing further input and output signals of further resonance modules using separate measurement circuitry and a common signal processing unit.

8. The method according to claim 1, further comprising multiplexing signals to be mixed with the single-side-band signal.

9. A system for tuning at least one tunable resonance module in a radio base station, said tunable resonance module having tuning means, a transmitter connection, and an antenna connection, said system comprising:

at least one single-side-band generator for forming a measuring signal from an input signal and an output signal to and from said tunable resonance module, said measuring signal being indicative of a difference In characteristics between said input signal and said output signal;

a first mixer for mixing an input signal, originating from a transmitter signal present on the transmitter connection, with a mixing signal having a second frequency, so as to generate a single side band signal, and said input signal having a first frequency and first signal characteristics;

a second mixer for mixing with the single side band signal an output signal being perturbed in signal characteristics from the input signal by a first difference in characteristics dependent on a present tuning of the resonance module, said output signal being one in a group consisting of: a signal originating from an antenna signal present on the antenna connection, a signal probed within the resonance module, and a signal reflected in said resonance module, and said output signal having a second frequency and second signal characteristics;

a third mixer for mixing the single side band signal with a signal originating from the transmitter signal on the transmitter connection;

comparator means for comparing, at a frequency range about that of the mixing signal, mixing products resulting from the second mixer and the third mixer, respectively, so as to determine a second difference in characteristics between the input and output signals;

operative means for operating, based on said second difference, the tuning means to tune the resonance module to a frequency of the transmitter signal present on the transmitter connection, so as to adjust said second difference to a predetermined value.

10. The system according to claim 9, wherein the single-side-band generator includes a sine-cosine signal generator means comprising:

first and second shift registers each having first and second groups of outputs, respectively, first and second outputs, first and second groups of resistors each resistor thereof being connected at the one side to one of the first and second groups of outputs and at the other side to the first and second output, respectively, first and second predetermined contents being shifted in the first and second registers, respectively, in cycles by clock pulses, duty cycles of the clock pulses, the predetermined contents, and values of the resistors being selected so that sine and cosine signals, which have a phase difference of 90°, are generated at the first and second outputs, respectively.

* * * * *